US012557253B2

United States Patent
Yu

(10) Patent No.: US 12,557,253 B2
(45) Date of Patent: Feb. 17, 2026

(54) BATTERY DISCONNECT UNIT

(71) Applicant: LG Energy Solution, Ltd., Seoul (KR)

(72) Inventor: Yong-Hwan Yu, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 418 days.

(21) Appl. No.: 18/020,131

(22) PCT Filed: Oct. 18, 2021

(86) PCT No.: PCT/KR2021/014523
§ 371 (c)(1),
(2) Date: Feb. 7, 2023

(87) PCT Pub. No.: WO2022/086101
PCT Pub. Date: Apr. 28, 2022

(65) Prior Publication Data
US 2023/0309278 A1    Sep. 28, 2023

(30) Foreign Application Priority Data

Oct. 20, 2020  (KR) ........................ 10-2020-0136057

(51) Int. Cl.
*H05K 7/20*      (2006.01)
*H01L 23/40*     (2006.01)
*H01L 25/11*     (2006.01)

(52) U.S. Cl.
CPC ..... *H05K 7/20927* (2013.01); *H01L 23/4006* (2013.01); *H01L 25/115* (2013.01);
(Continued)

(58) Field of Classification Search
CPC ....... Y02T 10/70; Y02E 60/10; H01L 23/473; H01L 23/40; H01L 23/4006;
(Continued)

(56) References Cited

U.S. PATENT DOCUMENTS

2009/0231811 A1* 9/2009 Tokuyama ............ H02M 7/537
                                                      361/699
2012/0013178 A1* 1/2012 Lim ...................... H02J 7/0045
                                                      307/9.1
(Continued)

FOREIGN PATENT DOCUMENTS

CN         206358000 U     7/2017
CN         210778713 U     6/2020
(Continued)

OTHER PUBLICATIONS

Guo et al. , Battery Pack, Espacenet translation (Year: 2020).*
(Continued)

*Primary Examiner* — Michael A Matey
(74) *Attorney, Agent, or Firm* — Lerner David LLP

(57) ABSTRACT

A battery disconnect unit including a housing, an electronic relay module installed on a charge/discharge line of a battery within the housing and including electronic switch devices capable of a switching operation of selectively blocking the flow of a current in the charge/discharge line, a heat dissipation cover provided with a structure surrounding at least a portion of the electronic relay module and formed of a material capable of heat exchange with the electronic relay module, and a cooling plate disposed in contact with the heat dissipation cover and provided to allow a refrigerant to flow in the cooling plate.

12 Claims, 6 Drawing Sheets

(52) U.S. Cl.
CPC ............... *H01L 2023/4031* (2013.01); *H01L 2023/4087* (2013.01)

(58) Field of Classification Search
CPC ........... H01L 25/115; H01L 2023/4031; H01L 2023/4087; H01M 2220/20; H01M 10/613; H01M 10/425; H01M 10/625; H01M 10/6553; H01M 10/6551; H01M 2010/4271; H01M 50/591; H01M 50/298; H01M 2010/4278; H02J 7/0031; H02J 7/0045; H05K 1/18; H05K 7/20927; H05K 2201/10053; H05K 2201/10166; H05K 1/0262; H05K 7/14329; H05K 7/2089; H05K 7/2039; H01H 45/12; H01H 50/14; H02M 7/537; H02M 7/003
See application file for complete search history.

(56) References Cited

U.S. PATENT DOCUMENTS

| | | | |
|---|---|---|---|
| 2012/0044647 A1 | 2/2012 | Lee et al. | |
| 2015/0214531 A1 | 7/2015 | Sun et al. | |
| 2019/0101598 A1* | 4/2019 | Cho | ................ G01R 31/36 |
| 2019/0379030 A1* | 12/2019 | Golubkov | ............ B60L 3/0046 |
| 2020/0235030 A1* | 7/2020 | Kim | ........................ H01L 23/40 |
| 2020/0313260 A1* | 10/2020 | Wang | ................... H01M 10/625 |
| 2021/0029846 A1* | 1/2021 | Revankar | ............ H01M 50/138 |

FOREIGN PATENT DOCUMENTS

| | | |
|---|---|---|
| CN | 111525211 A | 8/2020 |
| JP | H10-144836 A | 5/1998 |
| JP | 2009-219270 A | 9/2009 |
| JP | 2019-509008 A | 3/2019 |
| KR | 2012-0008393 A | 1/2012 |
| KR | 2012-0017983 A | 2/2012 |
| KR | 101185735 B1 | 9/2012 |
| KR | 2013-0129753 A | 11/2013 |
| KR | 101674466 B1 | 11/2016 |
| KR | 2018-0019359 A | 2/2018 |
| KR | 2018-0023647 A | 3/2018 |
| KR | 2018-0038300 A | 4/2018 |
| KR | 2020-0091240 A | 7/2020 |
| KR | 102159004 B1 | 9/2020 |
| WO | 2017196254 A1 | 11/2017 |

OTHER PUBLICATIONS

International Search Report for PCT/KR2021/014523 mailed Jan. 24, 2022. 3 pgs.

Extended European Search Report including Written Opinion for Application No. 21883170.9 dated Nov. 13, 2023, pp. 1-11.

* cited by examiner

BATTERY DISCONNECT UNIT

CROSS-REFERENCE TO RELATED APPLICATIONS

The present application is a national phase entry under 35 U.S.C. § 371 of International Application No. PCT/KR2021/014523 filed Oct. 18, 2021, which claims priority from Korean Patent Application No. 10-2020-0136057 filed Oct. 20, 2020, all of which are incorporated herein by reference.

TECHNICAL FIELD

The present disclosure relates to a battery disconnect unit, and more particularly, to a battery disconnect unit designed to use an electronic relay module without a risk of contact welding and to properly manage the temperature of the electronic relay module.

BACKGROUND ART

In electric vehicles (EVs), hybrid vehicles (HVs), and the like, large-capacity battery packs are mounted to supply electricity for driving.

A battery pack is connected to a load or a charger through a battery disconnect unit. The load refers to a device that receives power from a battery pack, such as a motor or inverter.

As shown in FIG. 1, the battery disconnect unit includes a high potential relay 10 installed on a line that connects a positive electrode terminal of a battery pack B to a positive electrode terminal of the load L, and a low potential relay 20 installed on a line that connects a negative electrode terminal of the battery pack B to a negative electrode terminal of the load L.

When the battery pack B is electrically connected to the load L, a large voltage of the battery pack B is abruptly applied to the load L, and thus an inrush current initially flows toward the load L. The rush current may cause irreversible damage by applying an electric shock to the load L.

Thus, the battery disconnect unit includes an RC circuit including a pre-charge resistor 40 and a capacitor 50, and a pre-charge relay 30 connected to the high potential relay 10 in parallel, When the battery pack B and the load L intend to be electrically connected to each other, the low potential relay 20 and the pre-charge relay 30 are primarily turned on. Then, a current output from the battery pack B flows to the capacitor 50 through the RC circuit, and the magnitude of the current flowing through the capacitor 50 gradually decreases as time increases.

When the pre-charge relay 30 is turned on and the magnitude of the current reaches a pre-charge target voltage that does not impact the load L, the high potential relay 10 is secondarily turned on, and then the pre-charge relay 30 is turned off, thereby completing electrical connection between the battery pack B and the load L.

Electro-mechanical relays that control interruption of metal contacts by using the excitation force of a magnetic coil and the restoration force of a spring have been widely applied as a high potential relay, a low potential relay, and a pre-charge relay.

However, in the electro-mechanical relays, malfunction may occur due to spring failure and contact corrosion, and contact damage or contact welding may occur whenever a high current is opened or closed. In addition, the electro-mechanical relays consumes a lot of power, generate much heat, have high failure rates and large sizes, are heavy because of most component parts made of metal, and are relatively expensive.

Because of these shortcomings of the electro-mechanical relays, electronic relays that supply or block power by using an electronic device such as an insulated gate bipolar transistor (IGBT) or a field effect transistor (FET) have recently been used as an alternative to the electro-mechanical relays. However, even in the case of electronic relays, when heat generation of the electronic device due to high current supply is not properly managed, the electronic device may be damaged, and thus a cooling device for electronic relays is needed. It is not easy to effectively configure the cooling device.

SUMMARY

Technical Problem

The present disclosure is designed to solve the problems of the related art, and therefore the present disclosure is directed to providing a battery disconnect unit including a cooling device for effectively cooling an electronic relay, as a battery disconnect unit using an electronic relay.

The technical problems to be solved in the present disclosure are not limited to the above, and other problems that are not mentioned could be clearly understood by one of ordinary skill in the art from the description of the present disclosure below.

Technical Solution

In one aspect of the present disclosure, there is provided a battery disconnect unit including: a housing; an electronic relay module installed on a charge/discharge line of a battery within the housing and comprising electronic switches configured to selectively block a flow of a current in the charge/discharge line; a heat dissipation cover surrounding at least a portion of the electronic relay module and formed of a material capable of heat exchange with the electronic relay module; and a cooling plate disposed in contact with the heat dissipation cover and configured to allow a refrigerant to flow in the cooling plate.

The electronic relay module may include a first electronic relay installed on a first line that connects a positive electrode terminal of the battery to a positive electrode terminal of an external device; a second electronic relay installed on a second line that connects a negative electrode terminal of the battery to a negative electrode terminal of the external device; and a gate driver connected to the first electronic relay and the second electronic relay and configured to control a switching operation of the electronic switches.

The gate driver may be a printed circuit board, and a plate surface of the gate driver may be positioned perpendicular to the first electronic relay or the second electronic relay.

The heat dissipation cover may include an upper cover and a lower cover configured to be coupled to each other. The lower cover may be a first block including three first protrusions on both edges and a center region of the lower cover, respectively, and two concave first accommodating grooves on respective sides of the center region. The upper cover may be a second block including three second protrusions aligned with the three first protrusions of the lower cover and two second accommodating grooves aligned with the two first accommodating grooves of the lower cover. Each of the first electronic relay and the second electronic relay may be positioned in a respective space between a respective first accommodating groove and a respective second accommodating groove.

First heat transfer pads may be positioned on surfaces of the first accommodating grooves and surfaces of the second accommodating grooves.

The battery disconnect unit may further include a thermal interface material (TIM) positioned between a lower surface of the lower cover and the cooling plate.

An upper surface upper cover may have a convex-concave pattern structure.

Each of the electronic switch devices may be an insulated gate bipolar transistor (IGBT) or a metal oxide semiconductor field effect transistor (MOSFET).

The housing may include a lower housing and a top cover configured to be coupled to each other. The heat dissipation cover may be fixedly disposed above the lower housing, the cooling plate may be fixedly disposed below the lower housing, and a portion of the lower housing below the heat dissipation cover may be open so that the heat dissipation cover and the cooling plate contact each other.

The battery disconnect unit may further include a refrigerant supply pipe connected to one side of the cooling plate and a refrigerant discharge pipe connected to another side of the cooling plate.

In another aspect of the present disclosure, there is provided a battery pack including the battery disconnect unit of any of the embodiments described herein.

In another aspect of the present disclosure, there is provided an electric vehicle including the above-described battery pack.

Advantageous Effects

According to an aspect of the present disclosure, a battery disconnect unit including a cooling device for effectively cooling an electronic relay may be provided as a battery disconnect unit using an electronic relay.

A battery disconnect unit according to the present disclosure has no worries about a contact welding phenomenon and may be made smaller and lighter than conventional battery disconnect units, because the battery disconnect unit employs an electronic relay using an electronic switch device instead of a large-sized electro-mechanical relay.

The effects of the present disclosure are not limited to the aforementioned effects, and effects not mentioned will be clearly understood by those of ordinary skill in the art to which the present disclosure belongs from the present specification and the accompanying drawings.

DETAILED DESCRIPTION

Figure 1:
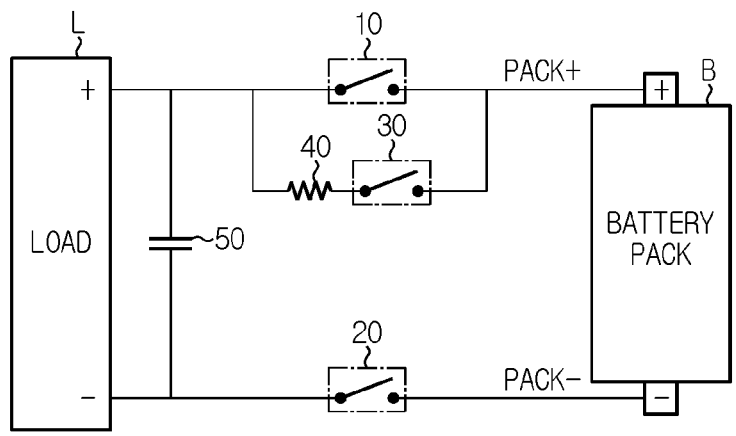
FIG. 1 is a circuit diagram of a conventional relay circuit unit interposed between a battery pack and a load.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the present disclosure, so it should be understood that other equivalents and modifications could be made thereto without departing from the scope of the present disclosure.

Since embodiments of the present disclosure are provided to more completely explain the present disclosure to those skilled in the art, the shapes and sizes of components in the drawings may be exaggerated, omitted, or schematically illustrated for clearer description. Thus, the size or proportion of each component do not fully reflect an actual size or proportion thereof.

Figure 2:
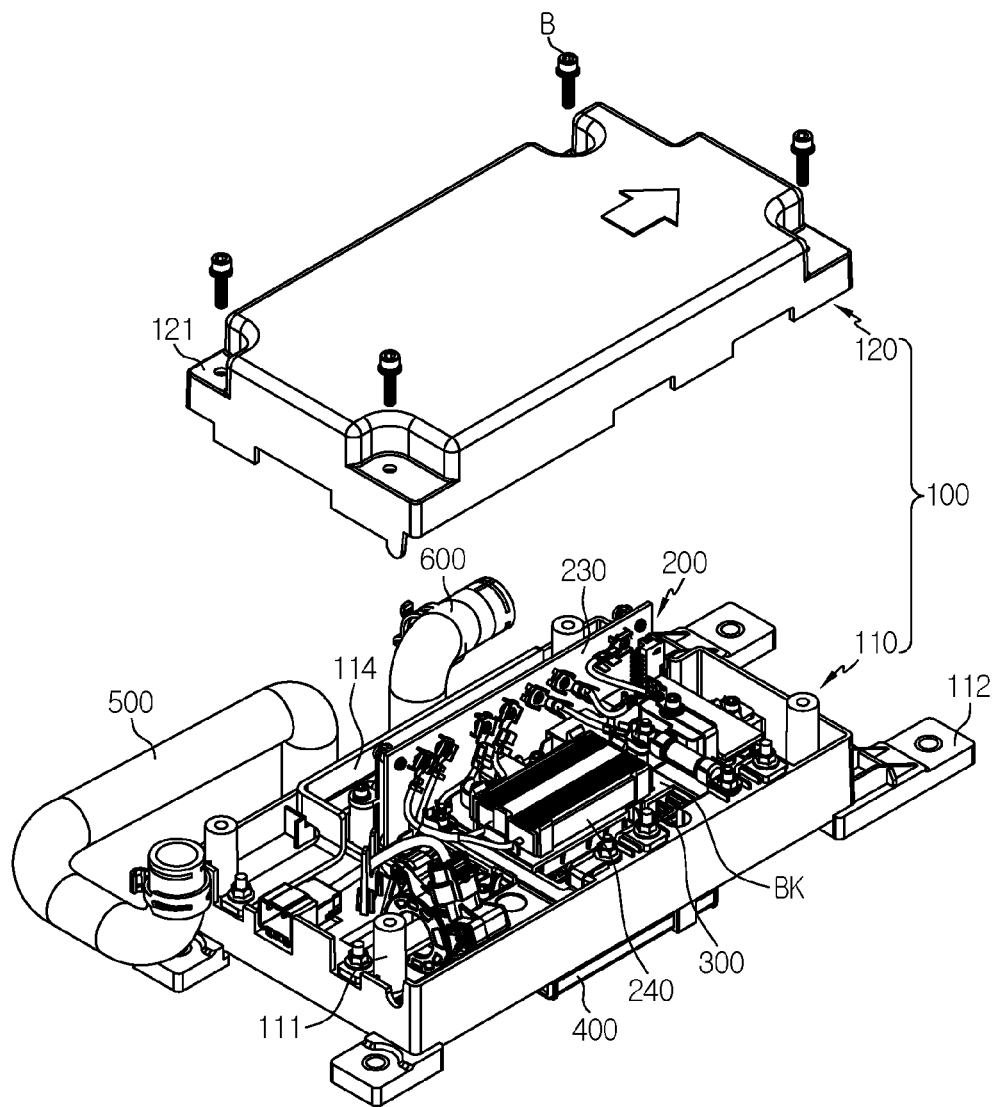
FIG. 2 is a perspective view of a battery disconnect unit according to an embodiment of the present disclosure.
Figure 3:
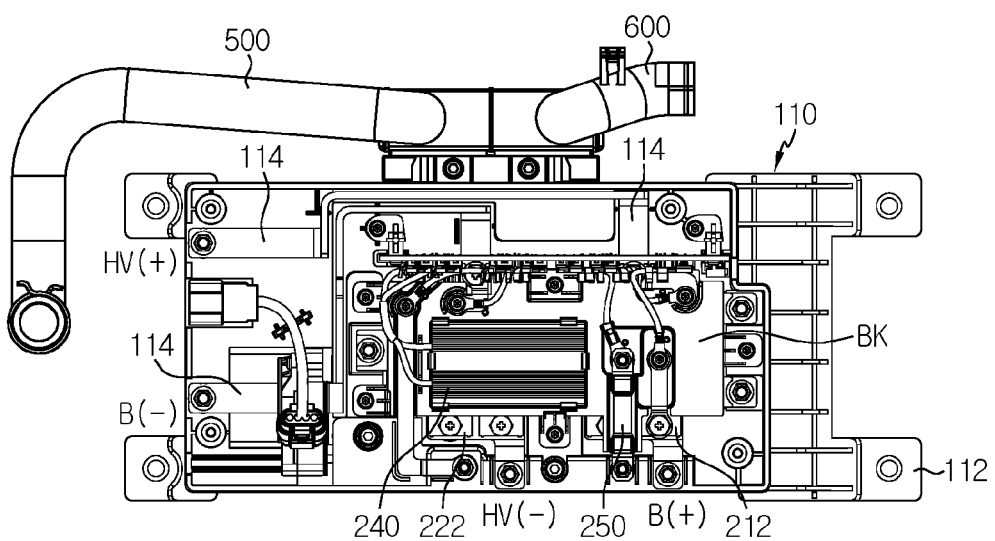
FIG. 3 is a plan view of the battery disconnect unit of FIG. 2 from which a top cover has been omitted.
Figure 4:
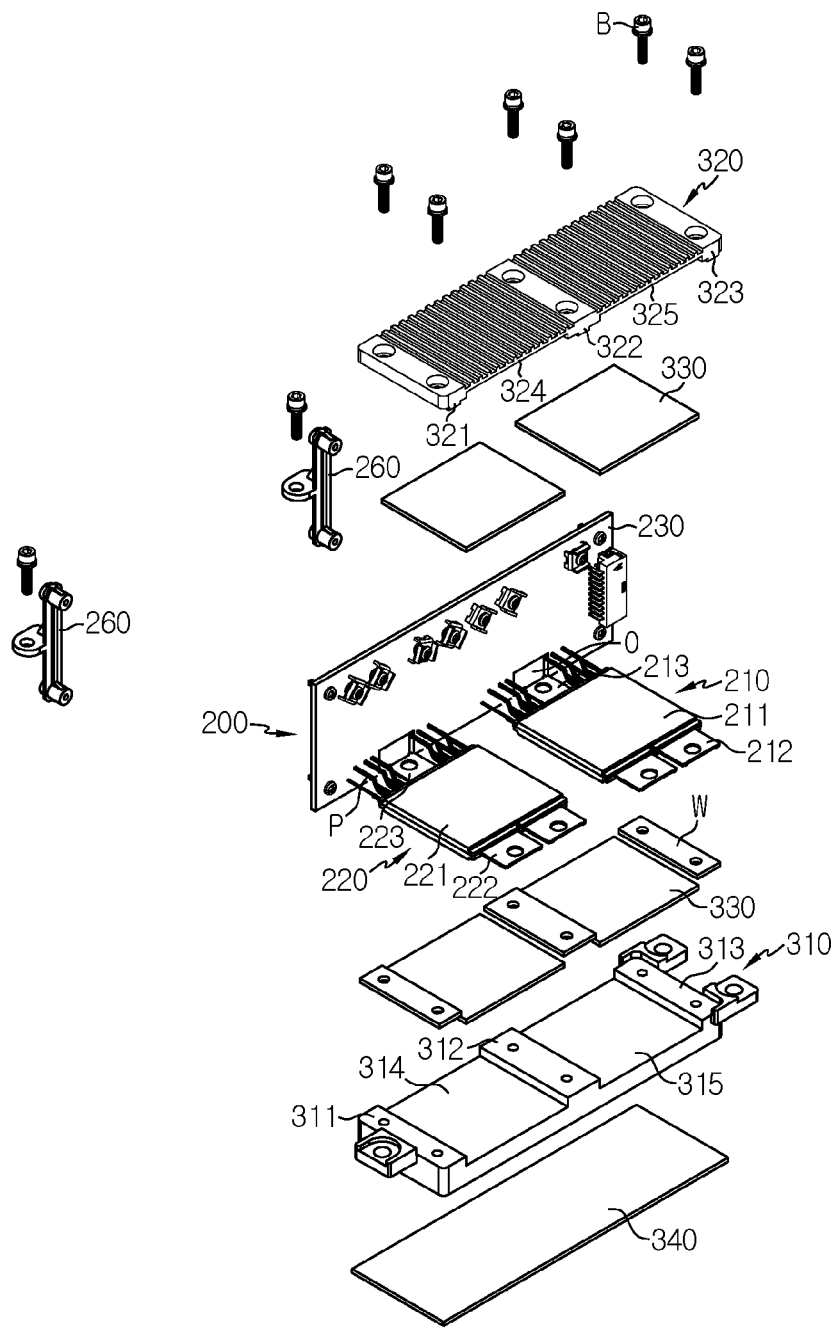
FIG. 4 is an exploded perspective view of an electronic relay module according to an embodiment of the present disclosure.
Figure 5:
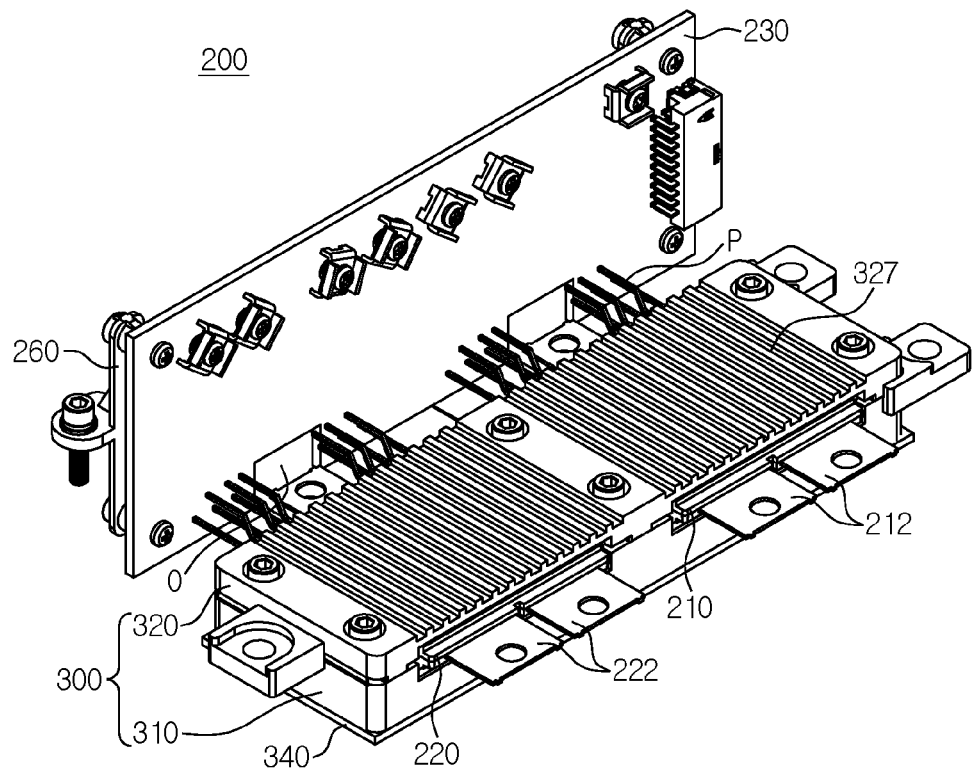
FIG. 5 is a combined perspective view of the electronic relay module of FIG. 4.

FIG. 2 is a perspective view of a battery disconnect unit according to an embodiment of the present disclosure, FIG. 3 is a plan view of the battery disconnect unit of FIG. 2 from which a top cover has been omitted, FIG. 4 is an exploded perspective view of an electronic relay module according to an embodiment of the present disclosure, and FIG. 5 is a combined perspective view of the electronic relay module of FIG. 4.

Referring to these drawings, the battery disconnect unit according to an embodiment of the present disclosure includes a battery disconnect unit (BDU) housing 100, an electronic relay module 200, a heat dissipation cover 300, a cooling plate 400, a refrigerant supply pipe 500, and a refrigerant discharge pipe 600.

The BDU housing 100 includes a lower housing 110 and a top cover 120 provided to be combinable with each other. The BDU housing 100 may be manufactured by injection molding, for example, a plastic resin.

The lower housing 110 has a box shape with an open top and is provided so that an electronic relay module 200, a current sensor, a pre-charge resistor 240, a plurality of bus bars 114, a cable, and the like may be installed therein. For example, as shown in the drawings, the various electrical components may be fixedly mounted on the lower housing 110 by using bolts/nuts or the like.

The top cover 120 has a shape with an open lower surface, and may be combinably provided over the lower housing 110.

For example, the lower housing 110 may include support rods 111 protruding upward in the form of columns at four corner areas, and the top cover 120 may include four mounting portions 121 formed to be flat to face-to-face contact upper end surfaces of the support rods 111. Holes are further formed in the four mounting portions 121, and, when hexagonal bolts B are inserted into the holes and fastened to the support rods 111, the top cover 120 may be fixedly coupled to the lower housing 110.

After the lower housing 110 is coupled with the top cover 120, the BDU housing 100 may be configured to have a sealed shape, except for an opening for entry of cables or the bus bars 114 for forming a charge/discharge line or connection of connectors on side portions of the BDU housing 100 and a lower side for connecting the cooling plate 400 for cooling the electronic relay module 200, which will be described later.

By reference, the battery disconnect unit according to the present embodiment is a component of a battery pack and may be installed within a pack case (not shown) that constitutes the battery pack. The battery disconnect unit may include four brackets 112 under lower ends of the four corners of the lower housing 110, respectively, such that the four brackets 112 may be used when the battery disconnect unit is installed inside the pack case.

The electronic relay module 200 may be installed to be located on a charge/discharge line of a battery inside the BDU housing 100. The battery refers to secondary battery cells included in the battery pack, the discharge line of the battery refers to a line connecting the battery to a device receiving power from the battery, such as a motor or an inverter of an electric vehicle, and the charge line of the battery refers to a line connecting a charger outside the battery pack to the battery.

The electronic relay module 200 includes electronic switch devices and selectively blocks the flow of a current in the charge/discharge line of the battery to stably supply power of a high voltage battery to, for example, the motor, or interrupt the supply of the power.

A conventional electro-mechanical relay module includes, for example, a main relay, a pre-charge relay, a pre-charge resistor, and the like. The main relay supplies or blocks power between a high-voltage battery and a motor, and the pre-charge relay and the pre-charge resistor prevents damage to a device due to an initial current. In the electronic relay module 200 according to the present disclosure, an electronic switch device plays the role of the main relay and the precharge relay of the electro-mechanical relay.

The electronic switch device is a semiconductor switch device for ON or OFF control, and may include one or more metal oxide semiconductor field effect transistors (MOSFETs) or one or more insulated gate bipolar transistors (IGBTs).

In detail, referring to FIG. 4, the electronic relay module 200 according to the present embodiment includes a first electronic relay 210, a second electronic relay 220, and a gate driver 230.

The first electronic relay 210 includes a first IGBT circuit unit, a first device case 211 for protecting the first IGBT circuit unit, and first terminal portions 212 and 213 each extending from the first IGBT circuit unit to outside of the first device case 211. The second electronic relay 220 includes a second IGBT circuit unit configured to have a circuit such that the flow of a current is induced in a reverse direction compared to the first IGBT circuit unit, a second device case 221 surrounding the second IGBT circuit unit, and second terminal portions 222 and 223 each extending from the second IGBT circuit unit to outside the second device case 221. The first electronic relay 210 and the second electronic relay 220 may be configured to be substantially the same as each other externally.

The first electronic relay 210 is connected to a positive electrode terminal B(+) of a battery and a positive electrode terminal HV+ of an external device via a bus bar 114 to selectively block the flow of a current in a high potential line. The second electronic relay 220 is connected to a negative electrode terminal B(−) of the battery and a negative electrode terminal HV− of the external device via another bus bar 114 to selectively block the flow of a current in a low potential line.

In the first electronic relay 210, the first terminal portion 212 from among the two first terminal portions 212 and 213 may be connected to the positive electrode terminal B+ of the battery via the bus bar 114, and the first terminal portion 213 from among the two first terminal portions 212 and 213 may be electrically connected to the positive electrode terminal HV+ of the external device via the other bus bar 114. In the second electronic relay 220, the second terminal portion 223 from among the two second terminal portions 222 and 223 may be connected to the negative electrode terminal B− of the battery via another bus bar 114, and the second terminal portion 222 from among the two second terminal portions 222 and 223 may be electrically connected to the negative electrode terminal HV− of the external device via another bus bar 114.

The gate driver 230 is connected to the first electronic relay 210 and the second electronic relay 220 to control a switching operation of the electronic switch device.

The gate driver 230 is communicable with a Battery Management System (BMS), and may be configured to turn on or off the electronic switch device according to a signal received from the BMS.

The gate driver 230 may be connected to the first electronic relay 210 and the second electronic relay 220 by using metal pins P.

In particular, the gate driver 230 according to the present embodiment may be implemented as a printed circuit board (PCB), and a plate surface thereof may be arranged perpendicular to the first electronic relay 210 or the second electronic relay 220.

For example, as shown in FIG. 4, the gate driver 230 may be arranged upright on left sides of the first electronic relay 210 and the second electronic relay 220, and may be integrally formed with the first electronic relay 210 and the second electronic relay 220 by the metal pins P formed of a rigid material. The gate driver 230 may be stably vertically arranged on the lower housing 110 by a support 260 provided such that its one end is bolt-fastened to the lower housing 110 and its other end is bolt-fastened to the gate driver 230.

The gate driver 230 may include a bus bar passage portion O configured to have a lower end partially recessed. The bus bar 114 forming a charge/discharge line may pass through the bus bar passage portion O and may be connected to the terminal portion 213 of the first electronic relay 210 or the terminal portion 223 of the second electronic relay 220 without bypassing the gate driver 230.

According to the above-described structure, the area of the lower housing 110 may be used more widely. In other words, when the gate driver 230 in the shape of a PCB is arranged perpendicular to a bottom surface of the lower housing 110, a space for mounting other components may be secured, and cable wiring may become easier. For example, as shown in FIG. 3, because the gate driver 230 is placed upright, it is easy to arrange components, such as the pre-charge resistor 240 and a fuse 250, adjacent to each other and simply connect them with a cable.

The heat dissipation cover 300 is a component for cooling and protecting the electronic relay module 200, and may be formed of a material capable of heat exchange with the electronic relay module 200 and may be provided to have a structure surrounding the first electronic relay 210 and the second electronic relay 220.

Referring back to FIGS. 4 and 5, the heat dissipation cover 300 according to the present embodiment may include a lower cover 310 and an upper cover 320 provided to be coupled to each other, and the lower cover 310 and the upper cover 320 may be formed of a material having excellent thermal conductivity, such as aluminum or graphite.

The lower cover 310 may be provided in a block shape including three first protrusions 311, 312, and 313 respectively located at both edges and a center of the lower cover 310 and two first accommodating grooves 314 and 315 concavely formed on both sides of the first protrusion 312 at the center of the lower cover 310.

The upper cover 320 may be provided in a block shape including three second protrusions 321, 322, and 323 and two second accommodating grooves 324 and 325 respectively corresponding to the three first protrusions 311, 312, and 313 and the two first accommodating grooves 314 and 315 of the lower cover 310 in a vertical direction.

The first electronic relay 210 and the second electronic relay 220 may be seated on the two first accommodating grooves 314 and 315 of the lower cover 310. At this time, heat transfer pads 330 may be first placed on respective surfaces of the first accommodating grooves to eliminate heat contact resistance according to a surface roughness difference between the lower cover 310, the first electronic relay 210, and the second electronic relay 220, thereby increasing heat conductivity.

An upper portion of the first electronic relay 210 and an upper portion of the second electronic relay 220 may be covered with the upper cover 320. At this time, other heat transfer pads 330 may be arranged on the upper portion of the first electronic relay 210 and the upper portion of the second electronic relay 220, and upper portions of the other heat transfer pads 330 may be covered with the upper cover 320. The three first protrusions 311, 312, and 313 of the lower cover 310 may be fastened to the three second protrusions 321, 322, and 323 of the upper cover 320 by using the bolts B. A plate-shaped washer W may be added between the first protrusions 311, 312, and 313 and the second protrusions 321, 322, and 323 to distribute an impact during the bolt fastening.

According to this structure, the first electronic relay 210 and the second electronic relay 220 may be constrained in spaces formed by the two first accommodating grooves 314 and 315 and the two second accommodating grooves 324 and 325, respectively. Because the heat dissipation cover 300 has a structure surrounding the first electronic relay 210 and the second electronic relay 220, when heat is generated in the first electronic relay 210 and the second electronic relay 220, the heat dissipation cover 300 may quickly absorb the heat.

Figure 6:
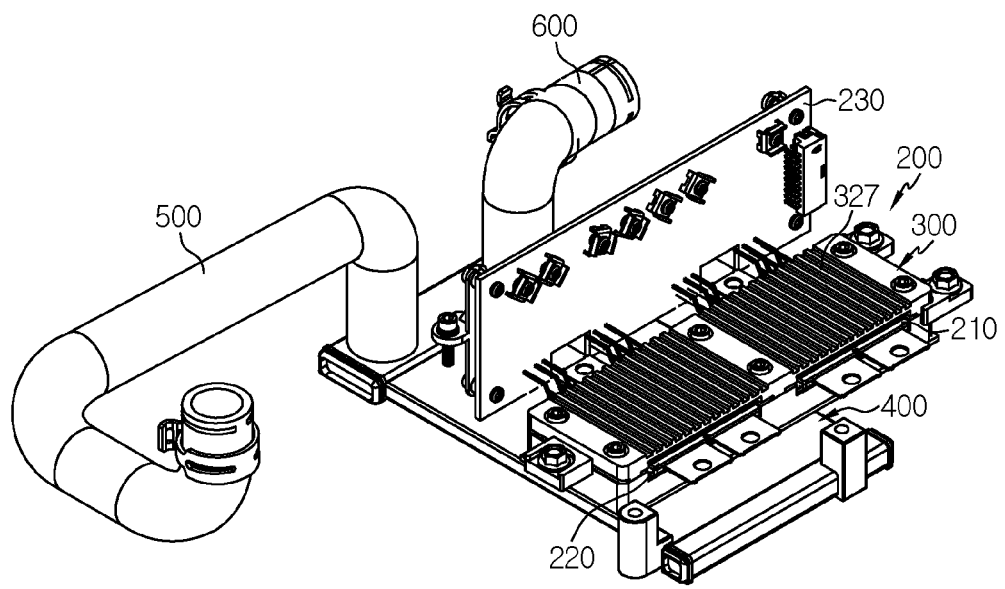
FIG. 6 is a perspective view of a cooling structure for the electronic relay module of FIG. 4.
Figure 7:
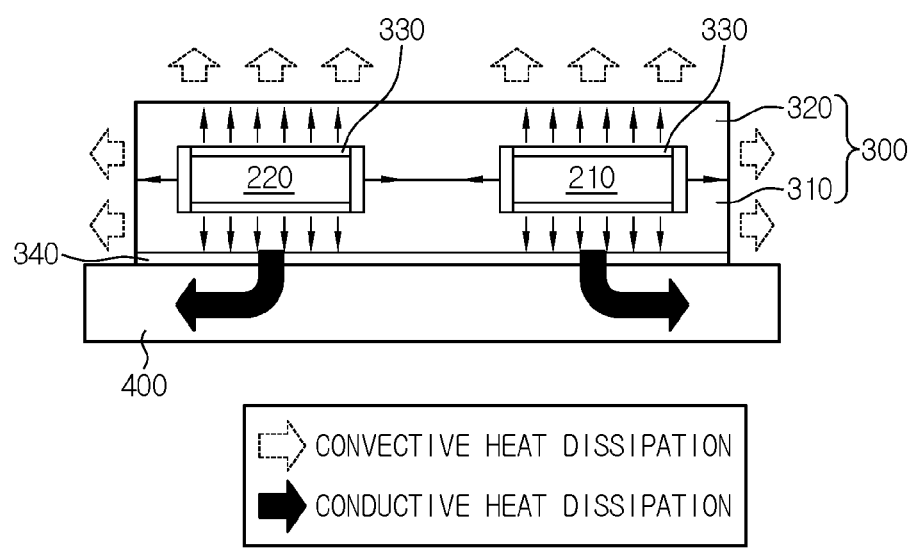
FIG. 7 is a conceptual view of a cooling structure of an electronic relay module according to an embodiment of the present disclosure.

A heat dissipation structure of the heat dissipation cover will now be described. The heat dissipation cover 300 according to the present embodiment may be cooled by convective heat dissipation and conductive heat dissipation. In other words, referring to FIGS. 6 and 7, the heat dissipation cover 300 according to the present embodiment may be configured to enable convective heat dissipation through its upper portion and its front, rear, left and right side portions and enable conductive heat dissipation by making the cooling plate 400 contact its lower portion.

To maximize an effect of convective heat dissipation, an upper surface of the upper cover 320 of the heat dissipation cover 300 may have a structure of a concave-convex pattern 327. In other words, convective heat dissipation is promoted by further increasing a contact area between the upper cover 320 and the atmosphere.

For conductive heat dissipation, the cooling plate 400 serving as a low temperature body having a lower temperature than the heat dissipation cover 300 is brought into contact with the lower surface of the lower cover 310 of the heat dissipation cover 300. In this case, a thermal interface material (TIM) may be interposed between the lower cover 310 and the cooling plate 400. A material having good thermal conductivity, such as thermal grease, a ceramic-mixed silicone resin, or carbon nanotubes, may be employed as the TIM 340. It may be advantageous for the TIM 340 to have an adhesive pad form rather than a liquid form in adhesively fixing the lower cover 310 to the cooling plate 400.

The cooling plate 400 may include a flow path formed in a hollow structure through which a refrigerant may flow, and may be provided in the form of a plate-shaped body. The cooling plate 400 is arranged under the heat dissipation cover 300 to cool the heat dissipation cover 300.

The refrigerant supply pipe 500 and the refrigerant discharge pipe 600 may be connected to one side or another side of the cooling plate 400, respectively. The refrigerant supply pipe 500 and the refrigerant discharge pipe 600 may communicate with a refrigerant supply main pipe (not shown) and a refrigerant discharge main pipe (not shown) for cooling the secondary battery cells in a conventional battery pack.

The refrigerant supply pipe 500 and the refrigerant discharge pipe 600 may communicate with the flow path within the cooling plate 400. The refrigerant may be cooling water, and is introduced into the cooling plate 400 via the refrigerant supply pipe 500 to absorb heat conductively dissipated by the heat dissipation cover 300, and is discharged from the cooling plate 400 through the refrigerant discharge pipe 600.

A flow rate of the refrigerant to be introduced into the cooling plate 400 via the refrigerant supply pipe 500 may be controlled by the BMS. For example, a temperature sensor capable of measuring the temperature of the electronic relay module 200 may be included in the lower housing 110, and data measured by the temperature sensor may be transmitted to the BMS. A flow rate of the refrigerant to be supplied to the cooling plate 400 may be differently adjusted by the BMS according to the temperature of the electronic relay module 200.

According to the present embodiment, the heat dissipation cover 300 is fixedly arranged on an upper portion of the lower housing 110, and the cooling plate 400 is fixedly arranged on a lower portion of the lower housing 110. A bottom of the lower housing 110 under the heat dissipation cover 300 is open.

In addition, in the battery disconnect unit according to the present embodiment (see FIGS. 2 and 3), the heat dissipation cover 300 surrounding the first electronic relay 210 and the second electronic relay 220 is fixedly arranged on the upper portion of the lower housing 110 by using bolts, and a bracket BK for mounting component parts is disposed on an upper portion of the heat dissipation cover 300. The bracket BK for mounting component parts is used to support the pre-charge resistor 240, and covers the upper surface of the heat dissipation cover 300 but forms a predetermined separation space between the bracket BK and the heat dissipation cover 300, thereby enabling convective heat dissipation of the heat dissipation cover 300. The bottom of the lower housing 110 under the heat dissipation cover 300 may be partially open. Through this open structure, a lower surface of the heat dissipation cover 300 may contact an upper surface of the cooling plate 400.

Such a battery disconnect unit according to the present disclosure has no worries about a contact welding phenomenon and may be made smaller and lighter than conventional battery disconnect units because the battery disconnect unit includes the electronic relay module 200 using electronic switch devices instead of large-sized electro-mechanical relays. Moreover, the electronic switch devices of the electronic relay module 200 may be managed to have optimal temperatures, and thus operation reliability and lifespan characteristics of the electronic switch devices may be improved.

A battery pack according to the present disclosure may further include one or more battery modules, various devices (not shown) for controlling charging/discharging of the battery modules, such as a BMS, a current sensor, and a fuse, and a pack case for accommodating them, in addition to the above-described battery disconnect unit.

Battery packs according to the present disclosure may be applied to vehicles such as electric vehicles or hybrid vehicles. In other words, a vehicle according to the present disclosure may be configured with the above-described battery disconnect unit according to an embodiment of the present disclosure and a battery pack including the above-described battery disconnect unit.

The present disclosure has been described in detail. However, it should be understood that the detailed description and specific examples, while indicating preferred embodiments of the present disclosure, are given by way of illustration only, since various changes and modifications within the scope of the present disclosure will become apparent to those skilled in the art from this detailed description.

Meanwhile, although terms indicating directions such as up, down, left, and right are used in the present specification, these terms are only for convenience of description, and it is apparent to those skilled in the art that these terms may vary depending on a position of a target object or a position of an observer.

What is claimed is:

1. A battery disconnect unit comprising:
   a housing;
   an electronic relay module installed on a charge/discharge line of a battery within the housing and comprising electronic switches configured to selectively block a flow of a current in the charge/discharge line;
   a heat dissipation cover surrounding at least a portion of the electronic relay module and formed of a material capable of heat exchange with the electronic relay module, wherein the heat dissipation cover comprises a lower cover including an accommodating groove, wherein the electronic relay module is positioned in the accommodating groove of the lower cover; and
   a cooling plate disposed in contact with the heat dissipation cover and configured to allow a refrigerant to flow in the cooling plate.

2. The battery disconnect unit of claim 1, wherein the electronic relay module comprises:
   a first electronic relay installed on a first line that connects a positive electrode terminal of the battery to a positive electrode terminal of an external device;
   a second electronic relay installed on a second line that connects a negative electrode terminal of the battery to a negative electrode terminal of the external device; and
   a gate driver connected to the first electronic relay and the second electronic relay and configured to control a switching operation of the electronic switches.

3. The battery disconnect unit of claim 2, wherein the gate driver is a printed circuit board, and a plate surface of the gate driver is positioned perpendicular to the first electronic relay or the second electronic relay.

4. The battery disconnect unit of claim 2, wherein the heat dissipation cover further comprises an upper cover configured to be coupled to the lower cover,
   the lower cover is a first block comprising three first protrusions on both edges and a center region of the lower cover, respectively, and two concave first accommodating grooves on respective sides of the center region,
   the upper cover is a second block comprising three second protrusions aligned with the three first protrusions of the lower cover, and two second accommodating grooves aligned with the two first accommodating grooves of the lower cover, and
   each of the first electronic relay and the second electronic relay is positioned in a respective space between a respective first accommodating groove and a respective second accommodating groove.

5. The battery disconnect unit of claim 4, wherein first heat transfer pads are positioned on surfaces of the first accommodating grooves and surfaces of the second accommodating grooves.

6. The battery disconnect unit of claim 4, further comprising a thermal interface material positioned between a lower surface of the lower cover and the cooling plate.

7. The battery disconnect unit of claim 4, wherein an upper surface of the upper cover has a convex-concave pattern structure.

8. The battery disconnect unit of claim 1, wherein each of the electronic switch devices is an insulated gate bipolar transistor (IGBT) or a metal oxide semiconductor field effect transistor (MOSFET).

9. The battery disconnect unit of claim 1, wherein the housing comprises a lower housing and a top cover configured to be coupled to each other,
   the heat dissipation cover is fixedly disposed above the lower housing,
   the cooling plate is fixedly disposed below the lower housing, and
   a portion of the lower housing below the heat dissipation cover is open so that the heat dissipation cover and the cooling plate contact each other.

10. The battery disconnect unit of claim 9, further comprising a refrigerant supply pipe connected to one side of the cooling plate and a refrigerant discharge pipe connected to another side of the cooling plate.

11. A battery pack including the battery disconnect unit of claim 1.

12. An electric vehicle comprising the battery pack of claim 11.

* * * * *